(12) United States Patent
You et al.

(10) Patent No.: US 11,653,513 B2
(45) Date of Patent: May 16, 2023

(54) QUANTUM DOT FILM, COLOR FILTER LAYER AND DISPLAY DEVICE

(71) Applicant: BOE Technology Group Co., Ltd., Beijing (CN)

(72) Inventors: Juanjuan You, Beijing (CN); Li Sun, Beijing (CN); Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 270 days.

(21) Appl. No.: 16/887,531

(22) Filed: May 29, 2020

(65) Prior Publication Data

US 2021/0167310 A1    Jun. 3, 2021

(30) Foreign Application Priority Data

Nov. 28, 2019 (CN) .......................... 201911194339.9

(51) Int. Cl.
*H01L 51/50* (2006.01)
*G02F 1/1335* (2006.01)
*H01L 27/32* (2006.01)
*H01L 51/52* (2006.01)
*G02F 1/017* (2006.01)

(52) U.S. Cl.
CPC ............ *H01L 51/502* (2013.01); *G02F 1/017* (2013.01); *G02F 1/133512* (2013.01); *G02F 1/133514* (2013.01); *H01L 27/322* (2013.01); *H01L 51/5284* (2013.01); *G02F 1/01791* (2021.01)

(58) Field of Classification Search
CPC ..... H01L 51/502; H01L 27/322; G02F 1/017; G02F 1/01791; G02F 1/133514; G02F 1/01
See application file for complete search history.

(56) References Cited

U.S. PATENT DOCUMENTS

| | | | |
|---|---|---|---|
| 2004/0036130 A1* | 2/2004 | Lee | G02F 1/3515 257/E29.082 |
| 2016/0061417 A1* | 3/2016 | Kim | G02B 6/0026 349/62 |
| 2021/0013382 A1* | 1/2021 | Hong | G02F 1/133603 |
| 2021/0189230 A1* | 6/2021 | Iida | B32B 27/36 |
| 2021/0373388 A1* | 12/2021 | Wang | G02F 1/133509 |

FOREIGN PATENT DOCUMENTS

| | | |
|---|---|---|
| CN | 103235442 A | 8/2013 |
| CN | 103412436 A | 11/2013 |
| CN | 104950518 A | 9/2015 |

(Continued)

OTHER PUBLICATIONS

English translation for CN-106932950-A (Year: 2017).*

(Continued)

*Primary Examiner* — Jonathan Y Jung
(74) *Attorney, Agent, or Firm* — Nath, Goldberg & Meyer; Joshua B. Goldberg

(57) ABSTRACT

The present disclosure provides a quantum dot film including a plurality of quantum dot material layers arranged in stack, the plurality of quantum dot material layers having refractive indices gradually ascending along a thickness direction of the quantum dot film. The present disclosure further provides a color filter layer and a display device.

16 Claims, 2 Drawing Sheets

(56) References Cited

FOREIGN PATENT DOCUMENTS

| CN | 105387384 | A |   | 3/2016  |         |             |
|----|-----------|---|---|---------|---------|-------------|
| CN | 106932950 | A | * | 7/2017  |         |             |
| CN | 206546482 | U |   | 10/2017 |         |             |
| CN | 107505767 | A | * | 12/2017 | ....... | G02F 1/133512 |
| CN | 109301056 | A |   | 2/2019  |         |             |
| WO | WO-2015025950 | A1 | * | 2/2015 | ........... | C09K 11/671 |

OTHER PUBLICATIONS

English translation for WO-2015025950-A1 (Year: 2015).*
Office Action dated Feb. 3, 2021 issued in corresponding Chinese Application No. 201911194339.9.

* cited by examiner

QUANTUM DOT FILM, COLOR FILTER LAYER AND DISPLAY DEVICE

CROSS-REFERENCE TO RELATED APPLICATION

The present application claims priority from Chinese patent application No. 201911194339.9, filed on Nov. 28, 2019, the present disclosure of which is hereby incorporated herein by reference in its entirety.

TECHNICAL FIELD

The present disclosure relates to the field of display devices, and in particular, to a quantum dot film, a color filter layer and a display device including the color filter layer.

BACKGROUND

With the development of display technology, quantum dot display devices having better color rendering capabilities have appeared. Quantum dot display devices mainly include the following three types: display devices including a quantum dot backlight source, display devices including a quantum dot color filter layer and display devices including a quantum dot light-emitting diode.

SUMMARY

The present disclosure provides a quantum dot film, including: a plurality of quantum dot material layers arranged in stack, the plurality of quantum dot material layers having refractive indices gradually ascending along a thickness direction of the quantum dot film.

In some embodiments, each of the plurality of quantum dot material layers includes a base layer and a plurality of quantum dots dispersed in the base layer, and among the plurality of quantum dot material layers, a quantum dot material layer having a highest refractive index has a higher quantum dot concentration than other quantum dot material layers.

In some embodiments, the refractive indices of the plurality of quantum dot material layers increase layer by layer along the thickness direction of the quantum dot film.

In some embodiments, a refractive index inside any one of the plurality of quantum dot material layers gradually increases along the thickness direction of the quantum dot film.

In some embodiments, the plurality of quantum dot material layers have two quantum dot material layers, a refractive index of a first quantum dot material layer of the two quantum dot material layers is lower than that of a second quantum dot material layer of the two quantum dot material layers, the base layer of the first quantum dot material layer includes polymethyl methacrylate, and the base layer of the second quantum dot material layer includes one of phenyl silicone resin and polythiol.

In some embodiments, a light transmittance of the base layer is not less than 60%. The present disclosure further provides a color filter layer including: a plurality of light filtering portions, each of the light filtering portions including the quantum dot film as described above, and the thickness direction of the quantum dot film being a light-outgoing direction of the color filter layer.

In some embodiments, each of the plurality of quantum dot material layers includes a base layer and a plurality of quantum dots dispersed in the base layer, and among the plurality of quantum dot material layers, a quantum dot material layer having a highest refractive index has a higher quantum dot concentration than other quantum dot material layers.

In some embodiments, the plurality of quantum dot material layers have refractive indices gradually ascending along the thickness direction of the quantum dot film.

In some embodiments, the plurality of quantum dot material layers have two quantum dot material layers, a refractive index of a first quantum dot material layer of the two quantum dot material layers is lower than that of a second quantum dot material layer of the two quantum dot material layers, the base layer of the first quantum dot material layer includes polymethyl methacrylate, and the base layer of the second quantum dot material layer includes one of phenyl silicone resin and polythiol.

In some embodiments, the color filter layer further includes a plurality of first light blocking portions, each of the plurality of first light blocking portions and each of the plurality of light filtering portions are alternately arranged.

The present disclosure further provides a display device including a display panel and the color filter layer as described above, the display panel includes a plurality of light emitting elements, and each of the plurality of light emitting elements emits, in the thickness direction, excitation light for exciting the color filter layer; and the color filter layer is arranged on the display panel along the thickness direction.

In some embodiments, each of the plurality of quantum dot material layers includes a base layer and a plurality of quantum dots dispersed in the base layer, and among the plurality of quantum dot material layers, a quantum dot material layer having a highest refractive index has a higher quantum dot concentration than other quantum dot material layers.

In some embodiments, a refractive index inside any one of the plurality of quantum dot material layers gradually increases along the thickness direction of the quantum dot film.

In some embodiments, the plurality of quantum dot material layers have two quantum dot material layers, a refractive index of a first quantum dot material layer of the two quantum dot material layers is lower than that of a second quantum dot material layer of the two quantum dot material layers, the base layer of the first quantum dot material layer includes polymethyl methacrylate, and the base layer of the second quantum dot material layer includes one of phenyl silicone resin and polythiol.

In some embodiments, the color filter layer further includes a plurality of first light blocking portions, each of the plurality of first light blocking portions and each of the plurality of light filtering portions are alternately arranged.

In some embodiments, the display panel further includes a plurality of second light blocking portions, each of the plurality of second light blocking portions and each of the plurality of light emitting elements are alternately arranged, and an orthographic projections of each of the first light blocking portions on a plane perpendicular to the first direction overlaps with that of a corresponding one of the plurality of second light blocking portions.

In some embodiments, the display device further includes a transparent protective layer disposed between the color filter layer and the display panel, and a refractive index of the transparent protective layer is lower than that of a quantum dot material layer closest to the transparent protective layer among the plurality of quantum dot material layers.

In some embodiments, the display panel is one of an OLED display panel, a micro-LED display panel, and a liquid crystal display panel.

BRIEF DESCRIPTION OF THE FIGURES

The accompanying drawings are provided for farther understanding of the present disclosure and constitute a part of the specification, and are used to explain the present disclosure together with the following embodiments, but are not intended to limit the present disclosure. In the drawings.

DETAILED DESCRIPTION

The embodiments of the present disclosure will be described in detail below with reference to the accompanying drawings. It should be understood that the embodiments described herein are only used to illustrate and explain the present disclosure, and are not intended to limit the present disclosure.

At present, quantum dot display devices have better color rendering capabilities, but the power consumption of quantum dot display devices is high.

One of the reasons for high power consumption of quantum dot display devices is a low light extraction efficiency of a quantum dot film provided in the quantum dot display device. To achieve a same luminance, a quantum dot display device having a quantum dot film with high light extraction efficiency consumes relatively less power, and a quantum dot display device having a quantum dot film with low light extraction efficiency consumes relatively more power.

Reasons for a low light extraction efficiency of a quantum dot material layer will be explained below.

Figure 1:
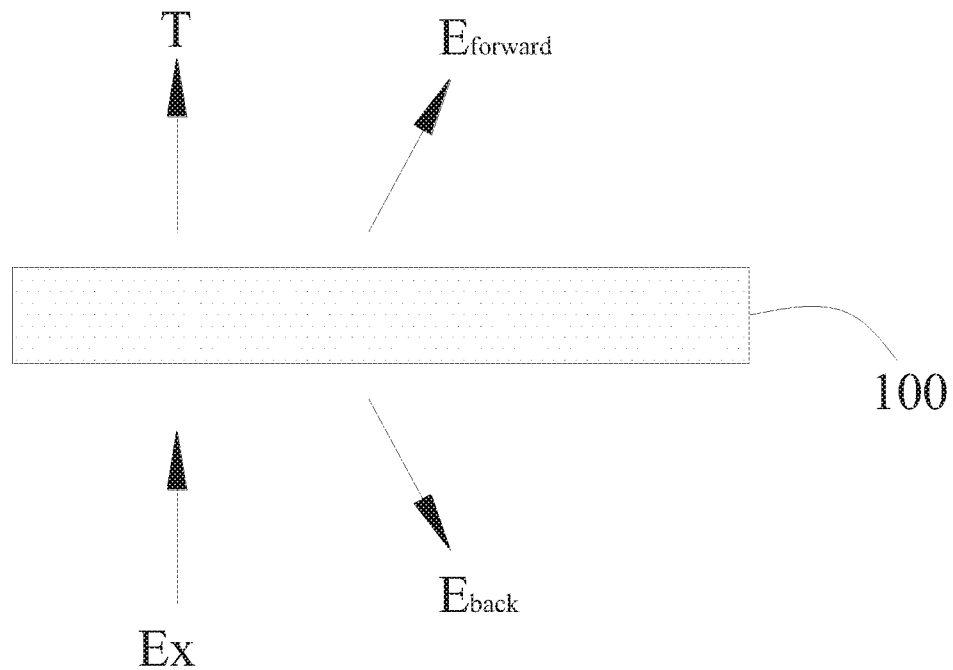
FIG. 1 is a schematic diagram illustrating the principle of low light extraction efficiency of a quantum dot film in the related art.

As shown in FIG. 1, a part of an excitation light Ex radiated by an excitation light source on a quantum dot film 100 directly passes through the quantum dot material layer as transmission light T, and the other part of the excitation light Ex is converted into light of a predetermined color by the quantum dots. The light of the predetermined color can be divided into two parts according to transmission directions thereof. An angle between the transmission direction of one of the two parts of the light of the predetermined color and the transmission direction of the excitation light Ex is less than 90 degrees, so the one part of the light is called a "transmitting-forward" light $E_{forward}$; and an angle between the transmission direction of the other part of the two parts of the light of the predetermined color and the transmission direction of the excitation light Ex is greater than 90 degrees, so the other part of the light is called a "transmitting-backward" light $E_{back}$. Only the transmitting-forward light $E_{forward}$ is effective, and the transmitting-backward light $E_{back}$ is ineffective.

According to an embodiment of the present disclosure, there is provided a quantum dot film, and the quantum dot film includes a plurality of quantum dot material layers arranged in stack, and the plurality of quantum dot material layers have refractive indices gradually ascending along a thickness direction of the quantum dot film. It should be noted that the quantum dot material layer refers to a film layer having quantum dot material, which may include a base layer and a plurality of quantum dots dispersed in the base layer, but the specific structure of the quantum dot material layer is not limited thereto. Herein, a refractive index of a quantum dot material layer refers to an equivalent refractive index of the quantum dot material layer, which can be calculated by the following formula (I):

$$n=(x,\lambda)=a+bx+c/\lambda^2 \quad (1).$$

where "n" is the equivalent refractive index of the quantum dot material layer, and "a", "b" and "c" are constants, "x" is a concentration of quantum dots doped in the quantum dot material layer, and "λ" is wavelength.

According to the embodiment of the present disclosure, excitation light irradiates the quantum dot film from one side of the quantum dot film and enters into the plurality of quantum dot material layers through an incident surface of the quantum dot film, and a refractive index of a quantum dot material layer in the quantum dot film becomes larger as a distance of the quantum dot material layer from the incident surface of the quantum dot film increases. Herein, the "incident surface" of the quantum dot film indicates a surface from which excitation light is incident to the inside of the quantum dot film.

As for any adjacent two quantum dot material layers in the quantum dot film, in a quantum dot material layer (i.e., the quantum dot layer distal to the incident surface of the quantum dot film) having a relatively high refractive index, a part of the light of the predetermined color, i.e., the light $E_{forward1}$, excited by quantum dots in the quantum dot material layer is transmitted forward and exits from a surface of the quantum dot material layer distal to the incident surface of the quantum dot film, and another part of the light of the predetermined color, i.e., the light $E_{back1}$, is transmitted backward and exits from a surface of the quantum dot material layer close to the incident surface of the quantum dot film. In this case, since when a part of the light $E_{back1}$ (i.e., the part of the light $E_{back1}$ having an incident angle greater than a critical angle) is incident from the quantum dot material layer having a relatively high refractive index to a quantum dot material layer having a relatively low refractive index, a total reflection occurs at an interface therebetween, and thus, the part of the light $E_{back1}$ is reflected at the interface therebetween and is transmitted forward again (i.e., directed to the surface, which is distal to the incident surface of the quantum dot film, of the quantum dot material layer having the relatively high refractive index) as a transmitting-forward light $E_{forward2}$. The light extraction efficiency of the quantum dot film is improved, due to the fact that the part of the transmitting-backward light is converted into the transmitting-forward light. Herein, a light "transmitted forward" indicates that an angle between a transmission direction of the light and a transmission direction of an excitation light is less than 90 degrees; and a light "transmitted backward" indicates that an angle between a transmission direction of the light and a transmission direction of the excitation light is greater than 90 degrees.

When the quantum dot film is used in combination with a light-emitting device, the light extraction efficiency of the light-emitting device can be improved.

The number of the quantum dot material layers in the quantum dot film is not particularly limited herein. For example, in an embodiment shown in FIG. 2, the quantum dot film includes two quantum dot material layers, i.e., a quantum dot material layer 110 and a quantum dot material layer 120, and a refractive index of the quantum dot material layer 110 is higher than that of the quantum dot material layer 120. When the excitation light Ex is radiated on the quantum dot material layer 120 (i.e., an incident surface of the quantum dot film), a part of the excitation light Ex directly passes through the quantum dot material layer 120 and enters into the quantum dot material layer 110 without being absorbed by the quantum dot material layer 110, and quantum dots in the quantum dot material layer 110 are excited to emit light of a predetermined color. The light of the predetermined color includes light $E_{forward1}$ transmitted forward and exiting from a surface of the quantum dot material layer 110 distal to the incident surface of the quantum dot film and the light $E_{back1}$ transmitted backward and irradiating on an interface between the quantum dot material layer 110 and the quantum dot material layer 120. As described above, since an incident angle of a part of the light $E_{back1}$ with respect to the interface between the quantum dot material layer 110 and the quantum dot material layer 120 can satisfy the total reflection condition, the part of the light $E_{back1}$ may be reflected by the interface back into the quantum dot material layer 110 as a light $E_{forward2}$ transmitted forward and finally exiting from the surface of the quantum dot material layer 110 distal to the incident surface of the quantum dot film.

It is easy to understand that, another part of the light of the predetermined color excited by the quantum dots of the quantum dot material layer 120, i.e., light $E_{back2}$, is transmitted backward and exits from the incident surface of the quantum dot film (i.e., a surface of the quantum dot material layer 120).

In the present disclosure, the refractive index of each quantum dot material layer is not particularly limited. For example, the quantum dot material layer 110 may have a refractive index of 1.7, and the quantum dot material layer 120 may have a refractive index of 1.5.

In the present disclosure, the light extraction efficiency of quantum dot film can be improved as long as a plurality of quantum dot material layers with different refractive indices are provided. Compared with improving the light extraction efficiency by changing material composition, improving quantum dot conversion rate or the like, the quantum dot film provided by the present disclosure has a low cost and better effect.

Figure 2:
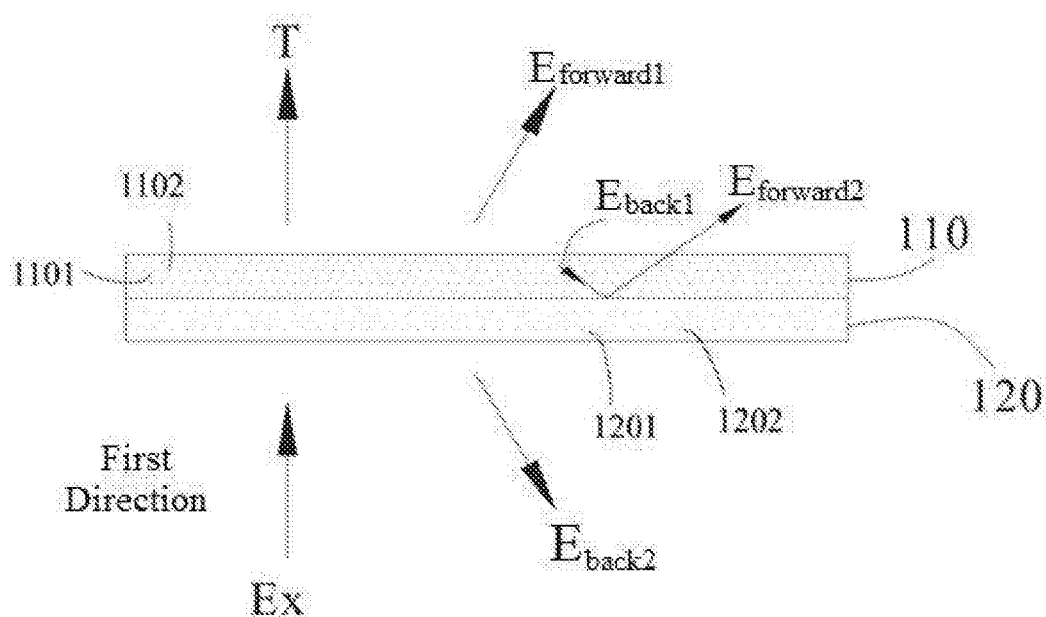
FIG. 2 is a schematic structural diagram of a quantum dot film according to an embodiment of the present disclosure.

In the present disclosure, as an alternative embodiment, the quantum dot material layer includes a base layer and a plurality of quantum dots dispersed in the base layer. As shown in FIG. 2, the quantum dot material layer 110 includes a base layer 1101 and a plurality of quantum dots 1102 dispersed in the base layer 1101, and the quantum dot material layer 120 includes a base layer 1201 and a plurality of quantum dots 1202 dispersed in the base layer 1201.

In order to increase the light conversion efficiency of the quantum dot film, in one embodiment, the quantum dot material layer located farthest from the incident surface of the quantum dot film has a higher quantum dot concentration than the other quantum dot material layer(s). That is, the quantum dot material layer located farthest from the incident surface of the quantum dot film has the highest quantum dot concentration. In other words, the excitation light directly passing through a quantum dot material layer with a relatively low quantum dot concentration may be converted into light of a predetermined color by quantum dots in the quantum dot material layer located farthest from the incident surface of the quantum dot film, after entering into the quantum dot material layer located farthest from the incident surface of the quantum dot film. Also, most of the excitation light is absorbed by the quantum dot material layer and converted into the light of the predetermined color since the quantum dot material layer has a relatively high quantum dot concentration. Compared with the case where a quantum dot material layer close to the incident surface of the quantum dot film has the highest quantum dot concentration, in the quantum dot film according to the embodiment of the present disclosure, loss of the light of the predetermined color caused by the light transmission in the quantum dot film is reduced and the light conversion efficiency is further improved.

For example, in the embodiment shown in FIG. 2, the quantum dot concentration in the quantum dot material layer 110 is higher than the quantum dot concentration in the quantum dot material layer 120. Therefore, most of the excitation light Ex directly passes through the quantum dot material layer 120 and enters into the quantum dot material layer 110, and then is converted into light of a predetermined color by the quantum dots in the quantum dot material layer 110, so that the light conversion efficiency is improved. In addition, since the transmitting-backward light Ebaclu of the light of the predetermined color converted in the quantum dot material layer 110 may be totally reflected at the interface between the quantum dot material layer 110 and the quantum dot material layer 120, the light conversion efficiency of the quantum dot film may be further improved.

In one embodiment, the quantum dot concentration in the quantum dot material layer 110 may be 40% and the quantum dot concentration in the quantum dot material layer 120 may be 30%.

In one embodiment, a light transmittance of the base layer is not less than 60%.

In another embodiment, a light transmittance of the base layer is not less than 80%.

In one embodiment, the material of the base layer may be selected from any one of polymethacry, late, epoxy resin, polyethylene terephthalate, and polyvinyl chloride.

It is noted that in some embodiments, by selecting a suitable material of the base layer, the refractive indices of the quantum dot material layers may increase layer by layer. For example, in the case where the plurality of quantum dot material layers have two layers, a base layer of a quantum dot material layer with a relatively low refractive index may be made of polymethyl methacrylate, and a base layer of a quantum dot material layer with a relatively high refractive index may be made of one of phenyl silicone resin and polythiol. Furthermore, in other embodiments, the refractive index of each quantum dot material layer may also be changed by changing the concentration of the doped quantum dots or changing the material of the doped quantum dots. For example, by controlling the concentration of doped quantum dots in each quantum dot material layer, the refractive index of the inside of each quantum dot material layer may be increased gradually. The above described methods of changing the refractive index of the quantum dot material layer are merely exemplary, and a person skilled in the art may change the refractive index of the quantum dot material layer in any suitable manner.

The material of the quantum dot is not particularly limited herein. The material of the quantum dot may be selected from one or more of zinc selenide, cadmium sulfide, cadmium selenide, and zinc sulfide, and the quantum dot may have a core-shell structure. The number of layers of shell of the quantum dot is not particularly limited herein, and the shell of the quantum dot may have a one-layer structure or a multilayer structure. When the quantum dots have a multilayer structure, materials of the multilayer shells may be the same or different. For example, when the shell of the quantum dot has a two-layer structure, the inner layer may be made of cadmium selenide, and the outer layer may be made of zinc sulfide.

The embodiment of the present disclosure further provides a color filter layer, the color filter layer includes a plurality of light filtering portions, each of the light filtering portions includes a plurality of quantum dot material layers arranged in stack, and the plurality of quantum dot material layers have refractive indices gradually ascending along a thickness direction of the light filtering portions.

For example, an excitation light irradiates the light filtering portion from one side of the light filtering portion and enters into the plurality of quantum dot material layers from an incident surface of the light filtering portion, and the refractive index of the quantum dot material layer in the light filtering portion gradually increases as a distance from the quantum dot material layer to the incident surface of the light filtering portion. Herein, the "incident surface" of the light filtering portion indicates a surface from which excitation light is incident to the inside of the light filtering portion.

The color filter layer provided according to the embodiment of the present disclosure may be used in combination with the display panel. The excitation light may be emitted by a light emitting element of the display panel and may excite the light filtering portion of the color filter layer to emit light of a predetermined color, so that the display panel can realize a colorful displaying.

In the color filter layer according to the embodiment of the present disclosure, a quantum dot material layer in the light filtering portion, which is located farthest from the incident surface of the light filtering portion, has a highest quantum dot concentration. The principle of the light filtering portion in the color filter layer for improving the light extraction efficiency is the same as the principle of the quantum dot film provided by the above embodiments of the present disclosure for improving the light extraction efficiency.

As for any adjacent two quantum dot material layers in the light filtering portion, in a quantum dot material layer having a relatively high refractive index (i.e., the quantum dot layer distal to the incident surface of the light filtering portion), a part of light of a predetermined color excited by the quantum dot material therein is transmitted forward and exits from a surface of the quantum dot material layer distal to the incident surface of the light filtering portion, and another part of the light of the predetermined color is transmitted backward and exits from a surface of the quantum dot material layer close to the incident surface of the light filtering portion. In this case, since when a part of the transmitting-backward light (i.e., satisfying that an incident angle thereof is greater than a critical angle) is emitted from the quantum dot material layer having a relatively high refractive index to a quantum dot material layer having a relatively low refractive index, a total reflection occurs at an interface therebetween, and thus, the part of the transmitting-backward light is reflected at the interface therebetween and transmitted forward again (i.e., directed to the surface, which is distal to the incident surface of the light filtering portion, of the quantum dot material layer having the relatively high refractive index) as a transmitting-forward light. The light extraction efficiency of the quantum dot film is improved, due to the fact that the part of the transmitting-backward light is converted into the transmitting-forward light. Herein, a light "transmitted forward" indicates that an angle between a transmission direction of the light and a transmission direction of an excitation light is less than 90 degrees; and a light "transmitted backward" indicates that an angle between a transmission direction of the light and a transmission direction of the excitation light is greater than 90 degrees.

Figure 3:
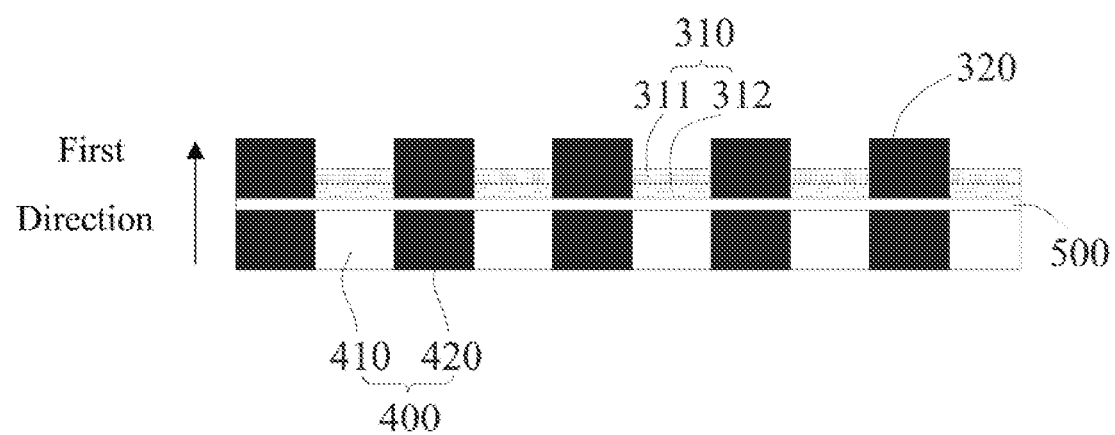
FIG. 3 is a schematic structural diagram of a display device according to an embodiment of the present disclosure.

In the embodiment shown in FIG. 3, the light filtering portion 310 includes two quantum dot material layers, i.e., a quantum dot material layer 311 and a quantum dot material layer 312 thereunder. The refractive index of the quantum dot material layer 311 is higher than the refractive index of the quantum dot material layer 312. It should be noted that, in the present disclosure, the light filtering portion including two quantum dot material layers is merely exemplary, and it is not intended to limit the present disclosure.

When the excitation light irradiates on the quantum dot material layer 3 (i.e., an incident surface of the light filtering portion 310) from one side of the light filtering portion 310, a part of the excitation light directly passes through the quantum dot material layer 312 and enters into the quantum dot material layer 311 without being absorbed by the quantum dot material layer 312, and quantum dots in the quantum dot material layer 311 are excited to emit light of a predetermined color. The light of the predetermined color includes light transmitted forward and exiting from a surface of the quantum dot material layer 311 distal to the incident surface of the light filtering portion and light (i.e., transmitting-backward light) transmitted backward and irradiating on an interface between the quantum dot material layer 311 and the quantum dot material layer 312. Since an incident angle of a part of the transmitting-backward light with respect to the interface between the quantum dot material layer 311 and the quantum dot material layer 312 can satisfy the total reflection condition, the part of the transmitting-backward light may be reflected at the interface back into the quantum dot material layer 311 and then transmitted forward and finally exits from the surface of the quantum dot material layer 311.

In the present disclosure, the thickness of each quantum dot material layer is not particularly limited herein, and for example, the thickness of the quantum dot material layer may be 1 μm.

In the present disclosure, the specific structure of the quantum dot material layer is not particularly limited herein. Alternatively, the quantum dot material layer includes a base layer and a plurality of quantum dots dispersed in the base layer, and in the light filtering portion, the quantum dot material layer located farthest from an incident surface of the light filtering portion has a highest quantum dot concentration, so that a light conversion efficiency for the excitation light may be further improved.

In one embodiment, a light transmittance of the base layer is not less than 60%. In another embodiment, a light transmittance of the base layer is not less than 80%. According to an embodiment of the present disclosure, the material of the base layer may be selected from any one of polymethacrylate, epoxy resin, polyethylene terephthalate, and polyvinyl chloride.

In the present disclosure, the material of the quantum dot is not particularly limited herein. The material of the quantum dot may be selected from one or more of zinc selenide, cadmium sulfide, cadmium selenide, and zinc sulfide, and the quantum dot may have a core-shell structure. The number of layers of the shell of the quantum dot is not particularly limited herein, and the shell of the quantum dot may have a one-layer structure or a multilayer structure. When the quantum dots may have a multilayer structure, materials of the multilayer shells may be the same or different. For example, when the shell of the quantum dot has a two-layer structure, the inner layer may be made of cadmium selenide, and the outer layer may be made of zinc sulfide.

In one embodiment, in order to improve the display effect of the display device using the color filter layer, the color filter layer further includes first light blocking portions 320, and the first light blocking portions 320 and the light filtering portions 310 are alternately arranged.

In the present disclosure, the material of the first light blocking portion 320 is not particularly limited herein, and for example, the material of the first light blocking portion 320 may be black matrix material.

The present disclosure further provides a display device including a display panel and a color filter layer. The display panel includes a plurality of light emitting elements, each of which emits excitation light for exciting the color filter layer in a first direction. The color filter layer is arranged on the display panel along the first direction and includes a plurality of light filtering portions, and each light filtering portion includes a plurality of quantum dot material layers arranged in stack, the quantum dot material layers having refractive indices gradually ascending along the first direction. An orthographic projection of each of the plurality of light emitting elements on a plane perpendicular to the first direction overlaps with an orthographic projection of a corresponding one of the plurality of light filtering portions on a plane perpendicular to the first direction.

For example, as shown in FIG. 3, the display device includes a color filter layer and a display panel 400, the display panel 400 includes a plurality of light emitting elements 410, each of the plurality of light emitting elements 410 emits excitation light for exciting the color filter layer along a first direction, and the color filter layer may be the color filter layer according to the embodiments of the present disclosure as discussed above. The plurality of light emitting elements 410 are in one-to-one correspondence with the plurality of light filtering portions 310 in one-to-one correspondence. That is, an orthographic projection of each of the plurality of light emitting elements 410 on a plane perpendicular to the thickness of the color filter layer (i.e., the first direction) overlaps with that of a corresponding one of the plurality of light filtering portions 310. The color filter layer is disposed on a light-outgoing side of the display panel. A quantum dot material layer 311 having a highest refractive index in the light filtering portion 310 is located farther from the display panel 400 than the quantum dot material layer 312.

The color filter layer according to the present disclosure has higher light extraction efficiency, and thus the display panel can realize higher luminance with lower power. That is, the display panel consumes less power.

In the present disclosure, the color of the excitation light emitted by the light emitting element 410 is not particularly limited herein. For example, the light emitting element 410 may emit blue light, or may also emit ultraviolet light. The light emitting element 410 may be an OLED or a LED.

In order to improve display effect, the display panel may further include second light blocking portions 420 corresponding to the first light blocking portions 320, respectively. That is, an orthographic projection of each of the first light blocking portions 320 on a plane perpendicular to the thickness direction of the color filter layer overlaps with that of a corresponding second light blocking component 420.

The second light blocking portions 420 may be made of a black matrix material.

In order to facilitate a formation of the color filter layer and protect the display panel 400, in one embodiment, a transparent protective layer 500 is disposed between the color filter layer and the display panel 400. In the present disclosure, the color filter layer may be formed by inkjet printing or transfer printing.

In order to further improve the light extraction efficiency of the light filtering portion 310, in one embodiment, the refractive index of the transparent protective layer 500 is lower than the refractive index of the quantum dot material layer of the light filtering portion adjacent to the transparent protective layer. That is, among light having a predetermined color transmitted backward in the quantum dot material layer of the light filtering portion adjacent to the transparent protective layer 500, a part of the light satisfying the following condition may be totally reflected on an interface between the transparent protective layer 500 and the quantum dot material layer: an incident angle of the part of the light with respect to the interface between the quantum dot material layer and the transparent protective layer 500 is greater than a critical angle required for total reflection. Therefore, at least a portion of the light having the predetermined color transmitted backward in the quantum dot material layer of the light filtering portion adjacent to the transparent protective layer 500, may be reflected back into the inside of the quantum dot material layer and finally exit from a surface of the light filtering portion distal to the transparent protective layer 500.

As an embodiment, material of the transparent protective layer 500 may be silicon nitride or silicon oxide.

It will be understood that the above embodiments are merely exemplary embodiments adopted to illustrate the principles of the present disclosure, and the present disclosure is not limited thereto. It will be apparent to those skilled in the art that various changes and modifications can be made without departing from the spirit and scope of the present disclosure, and these changes and modifications are intended to be included in the scope of the present disclosure.

What is claimed is:

1. A color filter layer, comprising: a plurality of light filtering portions, wherein each of the light filtering portions comprises quantum dot film having a plurality of quantum dot material layers arranged in stack, the plurality of quantum dot material layers have refractive indices gradually ascending along a thickness direction of the quantum dot film, and the thickness direction of the quantum dot film is a light-outgoing direction of the color filter layer.

2. The color filter layer of claim 1, wherein each of the plurality of quantum dot material layers comprises: a base layer and a plurality of quantum dots dispersed in the base layer, and
   wherein among the plurality of quantum dot material layers, a quantum dot material layer having a highest refractive index has a higher quantum dot concentration than other quantum dot material layers.

3. The color filter layer of claim 1, wherein the plurality of quantum dot material layers have refractive indices gradually ascending along the thickness direction of the quantum dot film.

4. The color filter layer of claim 2, wherein the plurality of quantum dot material layers have two quantum dot material layers, a refractive index of a first quantum dot material layer of the two quantum dot material layers is lower than that of a second quantum dot material layer of the two quantum dot material layers, the base layer of the first quantum dot material layer comprises polymethyl methacrylate, and the base layer of the second quantum dot material layer comprises one of phenyl silicone resin and polythiol.

5. The color filter layer of claim 1, further comprising a plurality of first light blocking portions, wherein each of the plurality of first light blocking portions and each of the plurality of light filtering portions are alternately arranged.

6. A display device, comprising: a display panel and the color filter layer of claim 1, wherein the display panel comprises a plurality of light emitting elements, and each of the plurality of light emitting elements emits excitation light in the thickness direction for exciting the color filter layer; and the color filter layer is arranged on the display panel along the thickness direction.

7. The display device of claim 6, wherein each of the plurality of quantum dot material layers comprises: a base layer and a plurality of quantum dots dispersed in the base layer, and wherein among the plurality of quantum dot material layers, a quantum dot material layer having a highest refractive index has a higher quantum dot concentration than other quantum dot material layers.

8. The display device of claim 6, wherein a refractive index inside any one of the plurality of quantum dot material layers gradually increases along the thickness direction of the quantum dot film.

9. The display device of claim 7, wherein the plurality of quantum dot material layers have two quantum dot material layers, a refractive index of a first quantum dot material layer of the two quantum dot material layers is lower than that of a second quantum dot material layer of the two quantum dot material layers, the base layer of the first quantum dot material layer comprises polymethyl methacrylate, and the base layer of the second quantum dot material layer comprises one of phenyl silicone resin and polythiol.

10. The display device according to claim 6, wherein the color filter layer further comprises a plurality of first light blocking portions, and each of the plurality of first light blocking portions and each of the plurality of light filtering portions are alternately arranged.

11. The display device according to claim 10, wherein the display panel further comprises a plurality of second light blocking portions, each of the plurality of second light blocking portions and each of the plurality of light emitting elements are alternately arranged, and an orthographic projection of each of the first light blocking portions on a plane perpendicular to the first direction overlaps with an orthographic projection of a corresponding one of the plurality of second light blocking portions on a plane perpendicular to the first direction.

12. The display device of claim 6, further comprising a transparent protective layer between the color filter layer and the display panel, wherein a refractive index of the transparent protective layer is lower than that of a quantum dot material layer closest to the transparent protective layer among the plurality of quantum dot material layers.

13. The display device of claim 6, the display panel is one of an OLED display panel, a micro-LED display panel, and a liquid crystal display panel.

14. The color filter layer of claim 1, wherein the refractive indices of the plurality of quantum dot material layers increase layer by layer along the thickness direction of the quantum dot film.

15. The color filter layer of claim 1, wherein a refractive index inside any one of the plurality of quantum dot material layers gradually increases along the thickness direction of the quantum dot film.

16. The color filter layer of claim 1, wherein a light transmittance of the base layer is not less than 60%.

* * * * *